United States Patent
Sun

(10) Patent No.: US 6,240,329 B1
(45) Date of Patent: May 29, 2001

(54) METHOD AND APPARATUS FOR A SEMICONDUCTOR WAFER INSPECTION SYSTEM USING A KNOWLEDGE-BASED SYSTEM

(76) Inventor: Chin-Yang Sun, 3361 Zaina La., Ukiah, CA (US) 95482

( * ) Notice: Subject to any disclaimer, the term of this patent is extended or adjusted under 35 U.S.C. 154(b) by 0 days.

(21) Appl. No.: 09/188,869

(22) Filed: Nov. 9, 1998

(51) Int. Cl.$^7$ ................................................. G06F 19/00
(52) U.S. Cl. ................ 700/110; 700/103; 700/105; 700/108; 700/109; 700/117; 700/121; 702/183; 702/185; 702/118; 438/14; 438/15; 438/17; 257/48; 257/620
(58) Field of Search ........................... 700/96, 103, 104, 700/105, 108, 109, 110, 117, 121; 702/117–118, 182, 183, 185, 186; 438/14, 15, 16, 17, 18; 257/48, 65, 620

(56) References Cited

U.S. PATENT DOCUMENTS

| | | | |
|---|---|---|---|
| 4,924,408 | 5/1990 | Highland | 364/513 |
| 4,935,876 | 6/1990 | Hanatsuka | 364/513 |
| 5,294,812 | * 3/1994 | Hashimoto et al. | 257/65 |
| 5,483,175 | * 1/1996 | Ahmad et al. | 438/18 |
| 5,504,369 | * 4/1996 | Dasse et al. | 257/620 |
| 5,548,714 | 8/1996 | Becker | 395/183.02 |
| 5,568,408 | * 10/1996 | Maeda | 702/117 |
| 5,831,865 | * 11/1998 | Berezin et al. | 700/110 |
| 5,844,803 | * 12/1998 | Beffa | 700/121 |
| 5,923,553 | * 7/1999 | Yi | 700/121 |
| 5,946,213 | * 8/1999 | Steffan et al. | 700/110 |
| 6,028,994 | * 2/2000 | Peng et al. | 700/110 |

* cited by examiner

*Primary Examiner*—Paul P. Gordon
*Assistant Examiner*—Ramesh Patel
(74) *Attorney, Agent, or Firm*—Thomas Schneck

(57) ABSTRACT

A method and apparatus for monitoring and reporting electrical test results for semiconductor wafer based on a knowledge base generated from user defined tables. A computer program fetches the test data from a wafer electrical tester, reads a test parameter specification table and computes various statistics for each parameter. Rules defining device failure modes are parsed to assemble boolean logic text strings. The logic is evaluated to generate boolean results. A pass/fail determination is made and the results are sent to process engineers for corrective action.

22 Claims, 6 Drawing Sheets

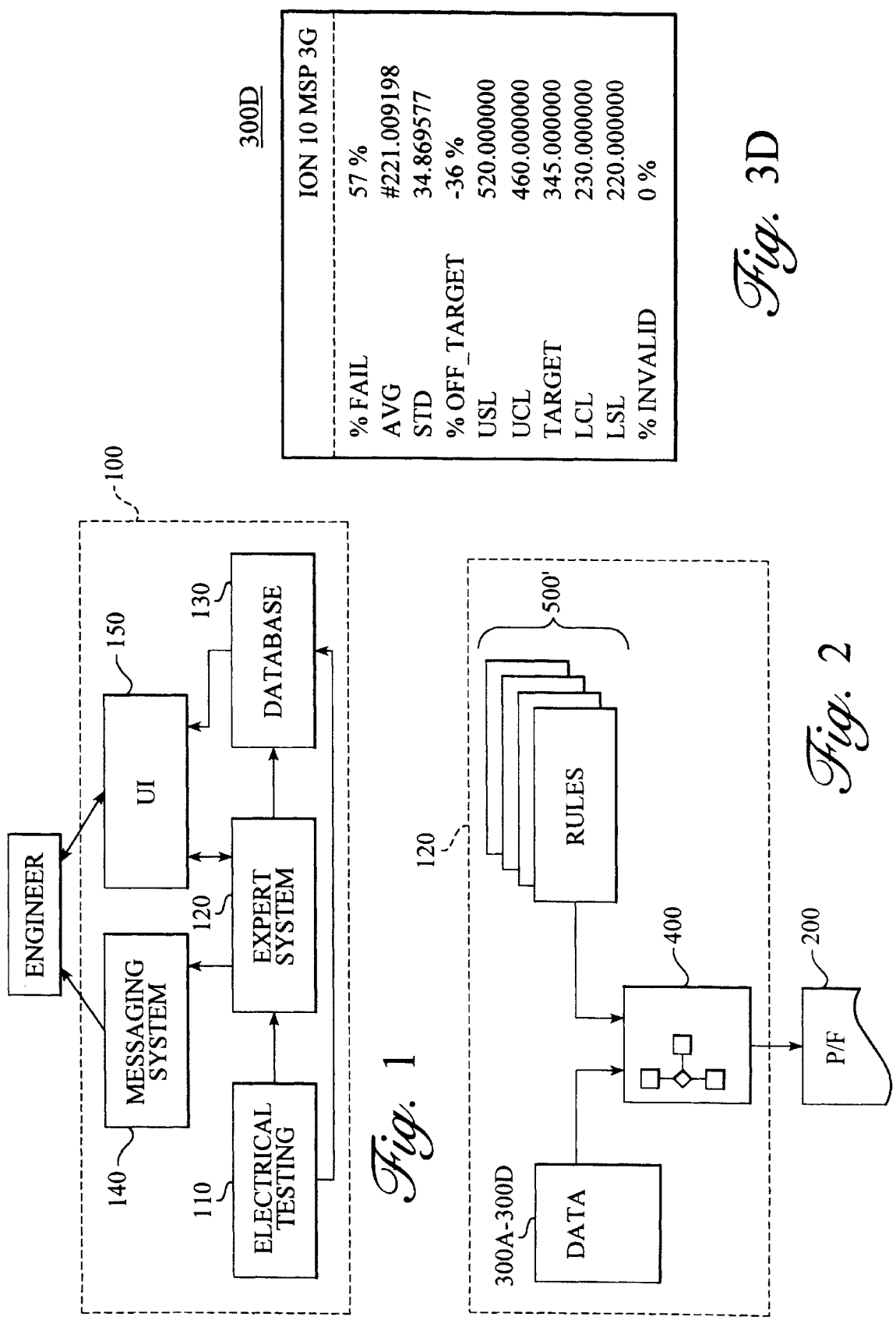

| WAFER # | OUT OF SPEC | OUT OF CTRL | INVALID | 50/0.9 VTN | 50/0.9 IDSN | 0.9N BVDSS |
|---|---|---|---|---|---|---|
| 1 | 1 | 1 | 0 | 0.772 | 19.020 | 12.255600 |
| 1 | 1 | 2 | 0 | 0.794 | 18.380 | 8.852000 |
| 1 | 0 | 1 | 1 | 0.771 | 19.166 | 8.896560 |
| 1 | 0 | 2 | 0 | 0.772 | 19.070 | 9.000400 |
| 1 | 1 | 1 | 0 | 0.759 | 19.330 | 8.974800 |
| ... | ... | ... | ... | ... | ... | ... |
| 48 | 1 | 0 | 0 | 0.783 | 18.894 | 9.191600 |
| 48 | 0 | 2 | 0 | 0.777 | 19.128 | 12.212400 |
| 49 | 0 | 1 | 0 | 0.759 | 19.330 | 8.974800 |
| 49 | 1 | 2 | 0 | 0.772 | 19.070 | 9.000400 |
| 49 | 1 | 1 | 0 | 0.771 | 19.166 | 8.965600 |
| 49 | 1 | 2 | 0 | 0.794 | 19.380 | 8.852000 |
| 49 | 1 | 1 | 0 | 0.772 | 19.020 | 12.255600 |
| AVG | | | | 0.753 | 19.040 | 9.891176 |
| STD | | | | 0.119 | 1.032 | 1.340613 |
| LCL | | | | 0.752 | 15.000 | 7.400000 |
| UCL | | | | 0.850 | 24.000 | 13.600000 |
| LSL | | | | 0.500 | 15.000 | 8.000000 |
| USL | | | | 0.900 | 24.000 | 13.500000 |
| VALID_LO | | | | 0.001 | 2.000 | 3.000000 |
| VALID_HI | | | | 1.500 | 30.000 | 20.000000 |
| % FAIL | | | | 5% | 1% | 1% |
| % INVALID | | | | 0% | 0% | 3% |
| % SPREAD | | | | 16% | 5% | 14% |

| WAFER # | 50/10 IDSN | 10N BVDSS | 50/10 NBODY | 50/0.9 VT | 50/0.9 IDS |
|---|---|---|---|---|---|
| 2 | *4.1864 | 13.650 | *0.463841 | *-1.453196 | *-5.8024 |
| 2 | *4.2336 | 13.572 | *0.460833 | *-1.434287 | *-5.9656 |
| 2 | *4.1844 | 13.590 | *0.464874 | *-1.466881 | *-5.6954 |
| 2 | *4.2124 | 13.629 | *0.460676 | *-1.453089 | *-5.9882 |
| 2 | *4.2092 | 13.581 | *0.462392 | *-1.457499 | *-5.998 |
| AVG | *H-4.2052 | 13.604 | *L-0.462523 | *L-1.45229 | *H-5.88992 |
| STD | 0.020374 | 0.034 | 0.001841 | 0.011865 | 0.13469 |
| LCL | 2.400000 | 11.000 | 0.635400 | -0.952500 | -11.50000 |
| UCL | 3.600000 | 14.000 | 0.714000 | -0.820000 | -6.00000 |
| LSL | 2.400000 | 11.000 | 0.550000 | -1.100000 | -11.50000 |
| USL | 3.600000 | 14.000 | 0.750000 | -0.700000 | -6.00000 |
| VALID_LO | 1.000000 | 5.000 | 0.100000 | -2.000000 | -20.00000 |
| VALID_HI | 11.000000 | 20.000 | 1.000000 | -0.001000 | -1.00000 |
| % FAIL | 100 % | 0 % | 100 % | 100 % | 100 % |
| % INVALID | 0 % | 0 % | 0 % | 0 % | 0 % |
| % SPREAD | 0.48% | 0.25% | 0.40% | 0.82% | 2.29% |

| | 50/0.9 VTN | 50/0.9 IDSN | 50/10 IDSN | 25/25C_VTN | 50/0.9 VTP |
|---|---|---|---|---|---|
| % FAIL | 100 % | 20 % | 100 % | 100 % | 100 % |
| AVG | *L0.186257 | 23.909600 | *H4.2052 | | *L-1.45299 |
| STD | 0.003696 | 0.133936 | 0.020374 | | 0.011865 |
| %OFF_TARGET | -76 % | 23 % | 40 % | 100% | -64 % |
| USL | 0.900000 | 24.000000 | 3.6000000 | 0.050000 | -0.700000 |
| UCL | 0.850000 | 24.000000 | 3.600000 | -0.009000 | -0.700000 |
| TARGET | 0.787500 | 19.500000 | 3.000000 | 0.062000 | -0.886250 |
| LCL | 0.725000 | 15.000000 | 2.400000 | -0.115000 | 0.952500 |
| LSL | 0.500000 | 15.000000 | 2.400000 | -0.250000 | -1.100000 |
| % INVALID | 0 % | 0 % | 0 % | 100% | 0 % |

| ROOT CAUSE: | UNDERDOSE VTI IMPLANT. | | |
|---|---|---|---|
| PARAMETERS: | 50/0.9 VTN | 50/0.9 VTP | 25/25C VTN |
| PASS STATUS: | OK/FAIL | OK/FAIL | OK/FAIL |
| OFF TARGET LIMIT: | < -15 | < -15 | < -15 |
| BOOLEAN: | AND | AND | - - - |
| ABS STATUS: | FALSE | FALSE | FALSE |
| CHECK INVALID: | TRUE | TRUE | FALSE |
| DIAG. LEVEL: | WAFER | | |
| FUZZY LOGIC: | TRUE | (PTR1_OFF_TARGET + PTR2_OFF_TARGET + PTR3_OFF_TARGET)/3 | |

Fig. 5A

| ROOT CAUSE: | MISSED VTI IMPLANT. | | |
|---|---|---|---|
| PARAMETERS: | 50/0.9 VTN | 50/0.9 VTP | 25/25C VTN |
| PASS STATUS: | FAIL | FAIL | FAIL |
| OFF TARGET LIMIT: | < 15 | < 15 | > 50 |
| BOOLEAN: | OR | OR | - - - |
| ABS STATUS: | FALSE | FALSE | FALSE |
| CHECK INVALID: | TRUE | TRUE | FALSE |
| DIAG. LEVEL: | WAFER | | |
| FUZZY LOGIC: | FALSE | PTR 1 | PTR 2 |

Fig. 5B

| ROOT CAUSE: | LOW ION. | | | | |
|---|---|---|---|---|---|
| PARAMETERS: | ION | 25/25 VTN | TUNPRGJCBV | VTE | PGM_JNCRS |
| PASS STATUS: | FAIL | OK | OK | OK | OK |
| OFF TARGET LIMIT: | < 0 | | | | |
| BOOLEAN: | AND | AND | AND | AND | - - - |
| ABS STATUS: | FALSE | FALSE | FALSE | FALSE | FALSE |
| CHECK INVALID: | TRUE | TRUE | TRUE | TRUE | TRUE |
| DIAG. LEVEL: | WAFER | | | | |
| FUZZY LOGIC: | FALSE | | | | |

Fig. 5C

METHOD AND APPARATUS FOR A SEMICONDUCTOR WAFER INSPECTION SYSTEM USING A KNOWLEDGE-BASED SYSTEM

TECHNICAL FIELD

The present invention relates generally to knowledge-based systems, and more particularly to expert systems for use in wafer inspection systems.

BACKGROUND ART

Expert systems are ubiquitous in the manufacturing environment. This is especially true in the semiconductor industry where wafer processing systems require constant monitoring to ensure adequate quality control to maintain acceptable product yields.

Building a knowledge base traditionally requires the services of a knowledge engineer working closely with line operators and support personnel to identify and classify problem-solving approaches. However, there sometimes is resistance to the idea of surrendering the decision-making process which takes place during the monitoring and adjusting of a process. Oftentimes, the expert (i.e. process engineer, line operator, etc.) is uncertain as to the knowledge engineer's formulation of the knowledge base and whether the expert's knowledge is being accurately transferred into the knowledge base. Once the information has been programmed by the knowledge engineer the expert has no control over the resulting knowledge base and adjustments require additional interaction with the knowledge engineer.

Various improvements have occurred during the evolution of knowledge-based systems. In U.S. Pat. No. 4,924,408, for example, a method is described for increasing the execution speed of a knowledge system by compiling the inference engine and the knowledge base into machine-level code. U.S. Pat. No. 4,935,876 a technique for managing knowledge databases as they increase in size due to the accumulation of knowledge. U.S. Pat. No. 5,548,714 discloses a graphically driven user interface wherein users who have no background in expert systems can construct an expert system.

What is needed is a technique for utilizing a knowledge-based system which increases accessibility to the knowledge base by the expert. It is further desirable that the knowledge base can be defined by the expert, absent the assistance of a knowledge engineer.

SUMMARY OF THE INVENTION

In accordance with the present invention, a method for automated acceptance testing of semiconductor wafers includes specifying a set of rules which define various device failure modes. Each rule includes one or more electrical test parameters and various criteria which define the failure mode. The method further includes selecting a rule and parsing the selected rule to extract the criteria contained in the rule. Next, one or more boolean expressions are created on the fly from the extracted criteria. The boolean expressions are executed to produce boolean results. A pass/fail determination is then made based on the boolean results. In a preferred embodiment of the invention, the method further includes combining some of the electrical measurements to produce a value which is then evaluated via fuzzy logic processing.

A wafer testing system according to the present invention comprises a wafer testing apparatus for making various electrical measurements on semiconductor wafers. A first data store is coupled to the testing device to receive and store the electrical measurements. A second data store contains rules which define various device failure modes. A computing unit includes software for accessing the second data store to create logic statements from attributes contained in the rules and from electrical measurements taken from the first data store. Additional software interprets the logic statements to produce logic results. Further software produces a pass/fail result based on the logic results.

BRIEF DESCRIPTION OF THE DRAWINGS

FIG. 1 is a block diagram of the wafer test system in accordance with the present invention.

FIG. 2 shows the data flow for analyzing and reporting on the wafer test results.

FIGS. 3A–3D are the various test summary tables used in the present invention.

FIGS. 5A–5C show rules of typical device failure modes.

BEST MODE FOR CARRYING OUT THE INVENTION

Figure 4:
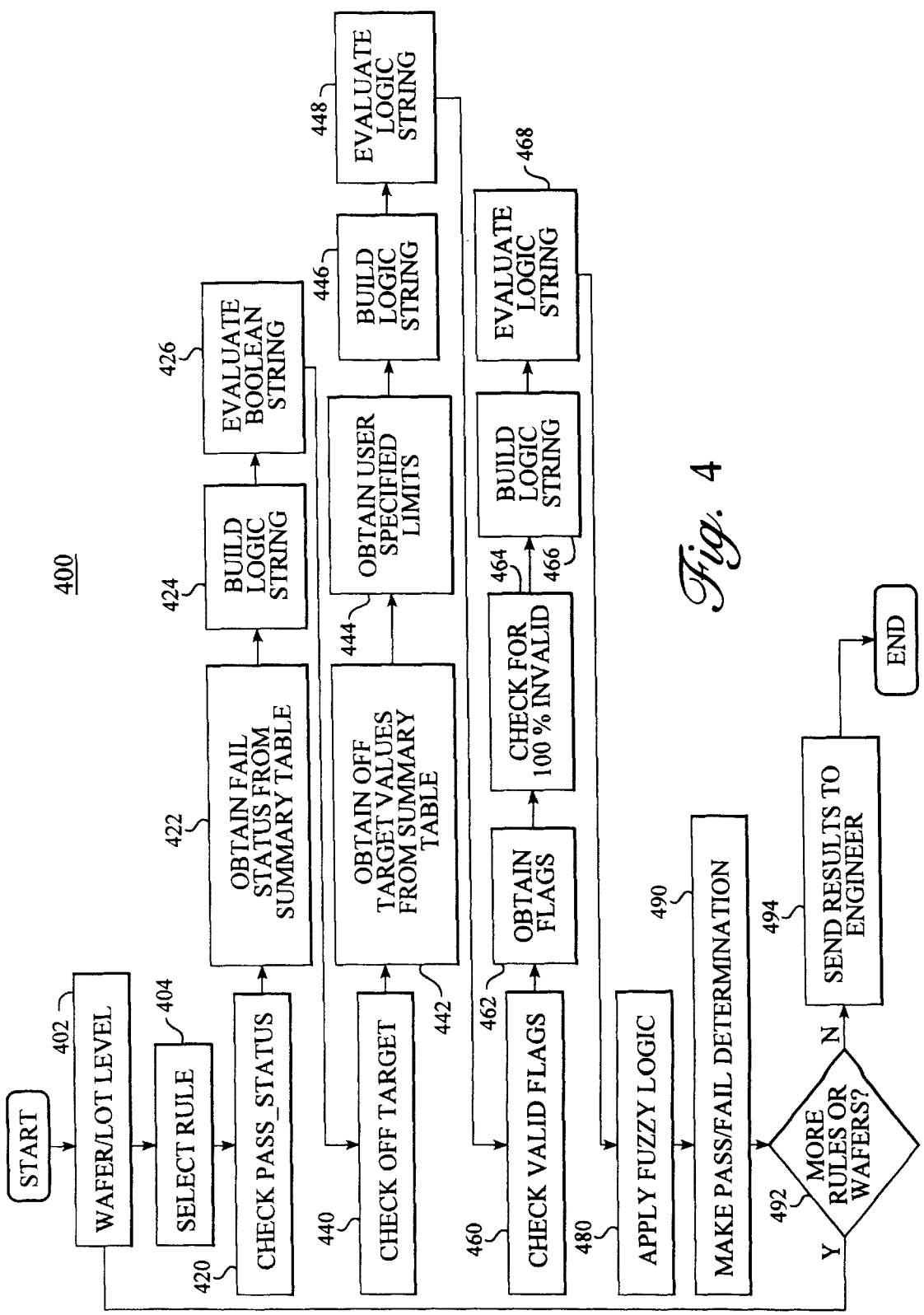
FIG. 4 is a flow chart showing the processing steps of the present invention.

Referring to FIG. 1, a wafer electrical test system 100 in accordance with the present invention includes a wafer electrical tester 110. The tester 110 performs a suite of electrical tests on each semiconductor wafer presented to it and feeds the test data into the expert system 120 of the invention and to a master database 130. In a manner to be explained below, the expert system 120 evaluates the measurement data and produces pass/fail determinations for each wafer that has been tested.

A user interface 150 provides access to the expert system 120 and to the master database 130. In accordance with the best mode of practicing the invention, the user interface is a graphical interface which provides the analytical tools found in a typical semiconductor fabrication facility. This includes utilities such as a trend analysis charting, wafer mapping, and Pareto analysis. In addition, a WEB browser provides the end user engineer with access to the Internet and to databases available on the Net.

The expert system is also coupled to a messaging system 140 for providing failure reports as feedback to other engineers involved in the fabrication process. Typically, this includes a hard copy printout of the report which is given to a process engineer for corrective action. Optionally, an electronic mail (email) feature might be provided so that such reports can be sent to appropriate personnel.

FIG. 2 shows the data flow in accordance with the present invention. The data collected by the tester 110 is summarized and formatted into tables 300A–300D. Rules 500' are combined with the summarized data per the flow chart 400 to produce test result reports 200, an example of which is shown in the discussions below. Following is a discussion of the components shown in FIG. 2.

Referring to FIGS. 1 and 3A–3D, expert system 120 comprises a variety of summary tables 300A–300D containing the electrical measurements made by electrical tester 110. A lot-level summary table 300A shown in FIG. 3A summarizes the electrical measurements for all of the wafers (in this case wafers 1–49) in a lot. Observe that there are five measurement entries for each wafer. This reflects the fact that electrical testing of a wafer consists of making a series of electrical measurements in five (or more) selected areas of the wafer. Each wafer is subjected to a host of electrical measurements. The summary table 300A lists only three such measurements: "50/0.9 VTN" refers to the threshold voltage for a 0.9 micron N-channel transistor; "50/0.9 IDSN" refers to the transistor saturation current at a drain voltage and gate voltage of 5 V in a 0.9 micron N-channel transistor; and "0.9N BVDSS" refers to the transistor drain breakdown with the gate, source and bulk regions grounded. However, modern wafer electrical test systems test a multitude of electrical parameters whose measurements normally would be included in the summary table 300A as well. The exemplary partial list of electrical parameters shown in FIG. 3A is illustrative only, since a full listing of the dozens of parameters would not be practical. Nonetheless, the partial listing is sufficient to present a best mode description of the elements of the present invention. It is understood that a complete summary table would include a full complement of electrical measurements.

Continuing with FIG. 3A, a section (304) of summary table 300A contains the actual electrical measurements taken for each wafer. As can be seen in the figure, the summary table includes measurements (five each) for forty-nine wafers, indicated by the numbers 1–49 along the left-hand side of the summary table. Various statistics are computed from these electrical measurements, including averages and corresponding standard deviation calculations as shown in section 310 of the summary table.

The lot-level summary table 300A also includes various limit values used to determine whether a wafer exhibits certain out of control, out of spec., or invalid status conditions. They include lower and upper control limits, LCL and UCL. These limits indicate the preferred range for a process. The process is said to be in control if the measurements fall between LCL and UCL. Lower and upper specification limits, LSL and USL, indicate the required range for a process. Measurements outside of this range indicate a process that is out of spec. and will result in scrapped devices. Valid_lo and Valid_hi limits indicate whether the data is valid or not. For example, invalid data would result if a probe was damaged since measurements taken by such a probe would produce nonsensical readings. Associated with this field is the percent invalid field which represents the number of measurements for a given parameter that fall outside of the valid_lo and valid_hi range.

A percent fail for each parameter is computed. This is computed by taking, for each parameter, the number of measurements which fall outside of the lower and upper spec. limits and dividing by the total number of valid measurements, expressed as a percentage.

Note that for each of the five measurements for each wafer, there are "out of spec.", "out of control", and "invalid" fields. These indicate how many of the corresponding electrical measurements fall into each category. For example, the second set of measurements for wafer 49 indicates that one of the measurements is out of spec. and two of the measurements are out of control.

Referring to FIG. 3B, a wafer-level summary table such as table 300B contains information similar to the lot-level table 300A, but only for a particular wafer. The wafer-level summary table is extracted from the lot-level summary table. New average and standard deviation values specific to the wafer are computed for the five measurements comprising each of the parameters and entered into the table.

FIG. 3B is a summary table for wafer #2, showing only a partial list of all the electrical measurements made for the wafer. In actuality, wafer-level summary table 300B contains the same list of parameters as in lot-level summary table 300A.

The summary tables may include certain failure indication symbols, namely "#", "*", and "?". These symbols may appear adjacent to the average values. For example, table 300B shows the symbol "*" next to the 50/10 IDSN measurements. The symbol "#" means the measurement is outside of the lower and upper control limits, LCL, UCL. The symbol "*" means the measurement is out of spec. The "?" symbol indicates an invalid measurement. In addition to the failure indication symbols, an "H" or an "L" may be indicated. These letter indicia signify whether an out-of-range measurement is on the high side of the limits or on the low side of the limits.

Finally, both the lot-level and the wafer-level summary tables include a percentage spread field. This field represents the normalized standard deviation of the recorded measurements. This allows comparison of the measurements' spread with different units.

Referring now to FIG. 3C, a failed parameters summary table 300C is shown for wafer #2. For practical reasons, as with tables 300A and 300B, FIG. 3C shows only a partial list of the parameters which were detected as failed. This table is created by inspecting the actual measurements for each of the electrical parameters in the wafer-level summary table 300B for wafer #2. Recall that each parameter has five associated electrical measurements. For each parameter, if the percent fail value exceeds or equals 20%, or the average value has "*" associated with it, then that parameter is entered into the failed parameter summary table 300C. This includes taking the average and standard deviation numbers and the limits of the failed parameter from the wafer-level table. A target value is then computed for each parameter in the table. This is simply the midpoint value between the lower and upper control limits. A percent off target value is computed for each failed parameter. This is done by subtracting the target value from the average value and expressing the difference as a percentage of the value target. The resulting percentage value will either be negative or positive, depending on whether the target value or the average value is greater. The sign therefore indicates whether the average value is on the high side of the target value or on the low side of the target value. FIG. 3C shows the use of the failure indication symbols ("#", "*", "?", "H", "L") discussed above.

Turning now to FIG. 3D, a lot-level failed parameters summary table 300D is shown. The table contains information similar to the wafer-level failed parameters summary table 300C of FIG. 3C. The table is created by scanning all of the measurements of all of the parameters of every wafer in the lot. Those parameters for which their average values have "*" associated with them (i.e. out of spec.) or % FAIL values which exceed or equal 20% are placed in table 300D, including average and standard deviation values and the various limits (LCL/UCL, LSL/USL, or valid_lo/valid_hi) for the failed parameter. A target value and a percent off target value are computed in the same manner as in the wafer-level fail table 300C. The table in FIG. 3D shows that the particular lot being represented has one failed parameter, namely the ION 10 MSP 3G parameter.

Referring to FIGS. 1 and 5A–5C, expert system 120 further comprises a table of rules, one of which is exemplified in FIG. 5A showing the structure of a rule in accordance with the invention. Each rule defines a failure mode of a wafer; for example the rule shown in FIG. 5A defines an underdose VTI implant failure. A root cause attribute associated with the rule indicates the root cause of the defined failure mode. Thus, a wafer exhibiting the properties defined in the rule of FIG. 5A will be reported as having a root cause of an underdose VTI implant.

Each rule comprises a plurality of electrical parameters which characterize the failure mode that is defined by the rule. The exemplary rule in FIG. 5A, for example, relies on the measurements of three electrical parameters, namely the N-channel and P-channel threshold voltages (50/0.9 VTN, 50/0.9 VTP) and the large structure N-channel threshold voltage (25/25C VTN). Other rules may require fewer or more parameters to characterize. As will be explained below, these rules can be created and subsequently modified by the engineer.

Each specified electrical parameter in turn has corresponding criteria which must be met in order to make the determination that the wafer or lot is characterized by the particular failure mode. These criteria include:

A pass status attribute indicates whether the rule requires that a particular electrical parameter fall within the spec. limits. An attribute of "FAIL" means the parameter falls outside of the spec. limits when the failure mode exists. An attribute of "OK" means the parameter falls within the spec. limits when the failure mode exists. An attribute of "OK/FAIL" means the parameter can be either within or outside of the spec. limits when the failure mode exists. This is essentially a don't care.

An off target limit attribute translates the engineer's judgment of the closeness of an electrical parameter toward a target limit. The formula for the off target limit is (average—target)/target*100, where "average" is the average of five or more electrical measurements and "target" is the point midway between the lower and upper control limits (LCL/UCL).

A boolean attribute allows the engineer to logically connect the off target limit criteria.

An absolute value attribute specifies whether the absolute value of an electrical measurement needs to be taken before processing. For example, P-channel and N-channel measurements will have opposite signs due to their opposite polarities. However, any meaningful comparison between two such measurements must be made irrespective of their signs; hence the absolute value attribute.

A check invalid attribute allows the engineer to specify whether a check should be made to determine the validity of any of the electrical measurements comprising a given rule. This is useful for screening out false positive determinations of a failed wafer by ensuring that the measurements used to make the determination that a wafer has failed are in fact out of spec. and not the result of some breakdown in the test equipment.

A diagnostic level attribute indicates whether the rule applies to each of the wafers comprising a lot or to the entire lot itself.

A fuzzy logic attribute permits the use of fuzzy logic processing on a mathematical combination of the electrical parameters. Typically, this attribute is used to represent the degree of an implant overdose or an implant underdose symptom.

In the case of a wafer-level diagnosis, as will be explained below, the metric used to analyze a parameter is the average value of the five electrical measurements made for each parameter. However, any one of the five the electrical measurements could be used as the metric instead without departing from the scope and spirit of the invention. From a statistics point of view, however, only average, standard deviation, and median can represent a whole population of data points.

Consider next examples of some rules, such as the rule in FIG. 5A. In order for a wafer to be characterized as having an underdose VTI implant symptom, three parameters must be inspected: a P-channel voltage threshold and two N-channel voltage thresholds. The OK/FAIL entries in the pass status attributes indicate that it is irrelevant whether the threshold values are within spec. The off-target limits show that an underdose symptom exists if each of the parameters is less than 15% below their respective target limits.

The rule in FIG. 5B defines a missed VTI implant problem. A P-channel threshold voltage and two N-channel threshold voltages characterize the failure mode. More specifically, a missed VTI implant has a signature of VTN≈+0.2V and VTP≈−1.4V. All three parameters must be out of spec., as indicated by the "FAIL" pass status attributes. Furthermore, the rule requires that the P-channel threshold be 15% less than its target limit of −1.4v, or that one of the two N-channel thresholds is 15% less than its target limit of +0.2v, or that the other of the two N-channel thresholds is 50% greater than its target limit (i.e. shifted). The fuzzy logic parameters PTR1 and PTR2 in FIG. 5B are defined as follows:

PTR1: global ptr1_off_target=(abs (global ptr1_avg−0.2)/0.2× 100)   (Eqn. 1)

PTR2: global ptr2_off_target=(abs (global ptr2_avg−1.4)/1.4× 100)   (Eqn. 2)

In the final example shown in FIG. 5C, the rule defines a low ion program-junction symptom. This rule tests five parameters: ion level, an N-channel voltage threshold, a tunnel program-junction breakdown voltage, a VTE, and a program-junction resistance. In order for a wafer to be identified as having this symptom, all but the ion level parameter must fall within spec. limits.

Recall from FIG. 1 that expert system 120 of the present invention is accessible via a user interface 150. This permits an engineer to access the expert system, not only to obtain an analysis of wafer electrical test results, but to provide access to the rules database themselves so that additional rules may be defined and existing rules may be adjusted. The electrical parameters and the corresponding attributes which comprise a rule are contained in a database and presented to the engineer via the interface. The format of the presentation is unimportant so long as the information can be read by the engineer and modified as needed. In the current implementation, the rules are presented in a spreadsheet format where the information is arranged in rows and columns. As will be explained below, the tabularized rules become the knowledge base as they are parsed and combined to create various boolean strings which are then executed to produce boolean results. This is the advantage of the invention, namely that the rules are presented in a readable tabular format thus providing easy access to them by an engineer without having to call on the services of a knowledge base programmer. Changes to the knowledge base are immediate and simple, requiring no training in knowledge base engineering.

Referring to FIGS. 2, 4 and 5A, information contained in the various summary tables 300A–300D and in the rules knowledge base 500' are processed in accordance with the flow chart 400 shown in FIG. 4. The programming language used to implement the flow chart is called RPL (Research Programming Language), a language used in a statistical package called RS/1 which is commonly used in the semiconductor industry. It is noted that any of a number of programming languages are appropriate for implementing the invention, since the invention lies in the design and information content of the various summary tables.

The process begins by selecting whether a wafer- or a lot-level diagnosis is to be performed, step 402. If doing a wafer-level analysis, then information will be taken from wafer-level summary table 300B and wafer-level fail table 300C. Similarly, if a lot-level diagnosis is desired, then information will be culled from lot-level summary table 300A and lot-level fail table 300D. Suppose for the following explanation that a wafer-level diagnosis is selected and the rule shown in FIG. 5A is selected for wafer #2, step 404.

First, the pass status of each electrical parameter comprising the rule is checked, step 420. Table 300C, the wafer-level failed parameters summary table, is accessed, step 422. As can be seen in FIG. 5A, the rule tests the following electrical parameters: 50/0.9 VTN, 50/0.9 VTP, and 25/25C VTN. The following logic string is then assembled, step 424: "BB[global ptr1] contains "OK/FAIL" AND BB[global ptr2] contains "OK/FAIL" AND BB[global ptr3] contains "OK/FAIL" ".

There are three logic terms in the above logic string, one for each of the three parameters in the rule shown in FIG. 5A. The string "OK/FAIL" in each logic term is derived from the pass status attribute of each parameter comprising the rule. The array BB[] in each logic term is a global array which is filled either with "OK" or "FAIL" by scanning the wafer-level failed parameters summary table 300C. The array is a data structure known as a blackboard in the R/S Decision Expert System for interacting with the database tables of the knowledge base. Specifically, the average value for each parameter is used. If the average value of a given parameter has a failure indication symbol, then "FAIL" will be placed in the BB[] entry, otherwise "OK" will be placed in the BB[] entry. Note that "OK" will be placed in the BB[] entry if the parameter does not appear in the failed parameters summary table as a default. Thus with respect to the failed parameters summary table for wafer #2, it can be seen that parameters 50/0.9 VTN, 50/0.9 VTP, and 25/25C VTN each has an asterisk (*) next to its corresponding average value, and so BB[ptr1], BB[ptr2], and BB[ptr3] each will be made to contain "FAIL".

For this step, the three logic terms are always connected by an AND operator, meaning that the pass status of each parameter comprising the rule must be in accordance with its corresponding pass status attribute in the rule. In this case, the rule states that an underdose implant condition may exist regardless of whether or not the average electrical measurements of the three parameters fall outside of its corresponding spec. limits. The reason is that for an under- or an over-dose problem, engineers rely on the percent off target values to test the extent of shifting, and so the pass status is irrelevant; hence the use of "OK/FAIL".

In step 426, the assembled logic string is passed on to an evaluation utility provided by the RPL programming language. An example of the function call is:

call exec (ptr_logic_string,true,successful);
where ptr_logic_string is a pointer to the string: "BB [global ptr1] contains "OK/FAIL" AND BB[global ptr2] contains "OK/FAIL" AND BB[global ptr3] contains "OK/FAIL" ". In this case the string will evaluate to TRUE.

Continuing with the flow chart of FIG. 4, the off target limit attributes are evaluated next to determine if any of the electrical parameters comprising the rule exceeds an engineer-determined limit, step 440. For each electrical parameter comprising the rule, the percent off target value in the failed parameters summary table 300C for wafer #2 obtained, step 442. Thus with respect to the example rule in FIG. 5A, the electrical parameters that will be checked are 50/0.9 VTN, 50/0.9 VTP, and 25/25C VTN. Referring to summary table 300C in FIG. 3C, the corresponding off target values for wafer #2 are: 50/0.9 VTN=−76%, 50/0.9 VTP=−64%, and 25/25C VTN=100% which is converted to −100%. The rationale for the conversion is to ensure that the off target test fails since FIG. 3C shows all the data are invalid for 25/25C VTN.

The off target limit attribute is extracted (parsed) from the rule, step 444. In this case the attributes are "<−15", "<−15", and "<−15" respectively for parameters 50/0.9 VTN, 50/0.9 VTP, and 25/25c VTN. The measurements and the off target limits are then combined to produce a logic string, step 446. This involves first forming the comparison terms, namely "((−76)<−15)" for the 50/0.9 VTN parameter, "((−64)<−15)" for the 50/0.9 VTP parameter, and "((−100)<−15)" for the 25/25C VTN parameter.

Next, the comparison terms are combined to form a boolean logic string. The logic connectors used for this step are obtained from the boolean attributes in the rule table, FIG. 5A. Each parameter has an associated logic connector.

Thus, parameter 50/0.9 VTN has an AND connector, and so the substring ""((−76)<−15) AND " is produced. The next parameter, 50/0.9 VTP also has an AND connector, and so the substring "((−64)<−15) AND " is concatenated with the first substring to produce "((−76)<−15) AND ((−64)<−15) AND ". The third parameter, being the last, has no corresponding logic connector for its off target attribute. The corresponding comparison term is concatenated to form the final boolean logic string, namely "((−76)<−15) AND ((−64)<−15) AND ((−100)<15)".

Finally, the logic string is then evaluated to produce a boolean result, step 448. The evaluation is done as described above, by making a "call exec()" function call and passing to the function a pointer to the above string. In this case the string evaluates to TRUE, indicating that all of the parameters are off target by the specified amount.

In constructing the comparison strings, the absolute value attribute can be used to modify the resulting string. In the example rule of FIG. 5A, the absolute attributes are FALSE, and so no modification occurs. However, suppose the absolute attribute for the 50/0.9 VTN parameter is TRUE. The effect of this on step 446 is to produce a string which includes absolute value functions thus producing the following boolean logic string: "(abs((−76))<−15) AND ((−64)<−15) AND ((−100)<−15)". During evaluation of the string in step 448, the absolute value of (−76) would be taken and the string would evaluate to FALSE.

Continuing with flow chart 400, after the off target check is made the valid flag attributes are processed, step 460. If any parameter for a given rule is deemed invalid, the failure mode associated with the rule will not be reported for the wafer. This screens out false positive determinations of a failed wafer when, for example, the out of spec. parameter(s) were the result of a failure in the test system or due to some other non-process specific error.

Thus, for each parameter in the rule, its valid flag is checked, step 462. For each valid flag that is TRUE, the percent invalid value for the corresponding parameter in the wafer-level failed parameters summary table is checked, step 464. If the percent invalid value is less than 100%, then at least one of the measurements for that parameter was valid and the parameter is deemed to be valid.

With respect to the rule in FIG. 5A, the following sequence occurs to build the boolean logic string, step 466. First, a default logic value of FALSE is provided resulting in the boolean string: "FALSE". Next, the first parameter 50/0.9 VTN has a valid attribute of TRUE, meaning that the validity of this parameter must be checked. Consulting the wafer-level failed parameters summary table 300C for wafer #2, it can be seen that this parameter has 0% invalid data. Thus, "OR FALSE" is concatenated to the boolean string, resulting in: "FALSE OR FALSE". The next parameter 50/0.9 VTP is then checked in the same manner. As can be seen from summary table 300C, the 50/0.9 VTP parameter also has zero invalid data, and so another "OR FALSE" is concatenated to the boolean string, resulting in: "FALSE OR FALSE OR FALSE". Finally, the 25/25c VTN parameter is checked. Here, it can be seen in the fail summary table 300C that this parameter is invalid since all five of the measurements for the parameter were out of spec. However, looking at the 25/25c VTN parameter in the rule in FIG. 5A, it can be seen that its valid flag is FALSE, and so there is no need to check the validity of this parameter. The final boolean string to be evaluated, therefore, is: "FALSE OR FALSE OR FALSE".

The logic string is then evaluated to produce a boolean result, step 468. The evaluation is done as described above, by making a "call exec()" function call and passing to the function a pointer to the above string. In this case the string evaluates to FALSE, meaning that none of the parameters of interest were deemed to be invalid.

The initial default value of "FALSE" is needed for those rules where a validity check is not desired for any of its constituent parameters. In such a case, the boolean string would consist only of the one term and would evaluate to FALSE meaning that there was no invalid data. Note that the TRUE/FALSE terms are connected by OR so that any parameter deemed to contain invalid data will force the string to evaluate to TRUE.

Next in flow chart 400, fuzzy logic is used to make a determination as to the degree of the failure mode, such as an implant over- or under-dose symptom, step 480. If the fuzzy logic attribute is TRUE, then a user specified combination of the off target values is compared against a set of user-modifiable ranges. For example, the rule in FIG. 5A shows that an average of the off target values of each of the three parameters is to be computed. This average is then compared against the following list of ranges:

80–100 Most Likely
60–79 Very Likely
40–59 Likely
20–39 Probably
0–19 Maybe

The corresponding text associated with each range serves as a modifier in the report of the results.

Finally, a pass/fail determination is made, step 490. This is done by combining the boolean results from steps 426, 448 and 468. If the pass status and off target analyses evaluate to TRUE and the invalid check evaluates to FALSE, then a report will issue indicating that a test device on the wafer exhibit the failure mode defined by the rule and that those parameters comprising the rule whose validity is significant tested out to be valid. If fuzzy logic was used, the report will include the corresponding modifier. If, on the other hand, either the pass status or the off target analyses evaluated to FALSE, then the wafer does not exhibit the failure mode and no report will issue for the particular failure mode. If the invalidity analysis evaluated to TRUE, again no report will issue on the assumption that the electrical measurements for at least one of the parameters comprising the rule were all invalid.

In the case of wafer #2, the pass status evaluated to TRUE, the off target analysis evaluated to TRUE, and the parameters were deemed to be valid. Wafer #2 therefore exhibits the failure mode defined by the rule in FIG. 5A and the following report will issue:

wafer ID: 2 very likely underdose VTI implant.

If additional rules need to be checked or additional wafers or lots need to be tested, then the process is repeated via step 492. When the analysis is complete, the pass/fail determinations are compiled into a report that is then sent to a process engineer, step 494. This can be accomplished, for example, by emailing the report to the engineer.

A typical report 200 as indicated in FIG. 2 might include the following:

wafer ID: 2 very likely underdose VTI implant.
wafer ID: 2 has missed VTI implant.
wafer ID: 8 has thicker gate oxide.
wafer ID: 8 has low ion.
wafer ID: 10 has under dose VPI implant.
wafer ID: 11 has under dose VPI implant.
wafer ID: 11 has low ion.
wafer ID: 14 has low ion.
wafer ID: 15 most likely underdose VTI implant.
wafer ID: 20 has under dose VPI implant.
wafer ID: 23 has under dose VPI implant.
wafer ID: 23 has low ion.
wafer ID: 26 has low ion.
wafer lD: 27 has low ion.
wafer ID: 27 most likely underdose VTI implant.
wafer ID: 28 has under dose VPI implant.
wafer ID: 28 has low ion.
wafer ID: 33 most likely underdose VTI implant.
wafer ID: 34 has low ion.
wafer ID: 38 has under dose VPI implant.
wafer ID: 41 has low ion.
wafer ID: 44 has low Ion.
wafer ID: 45 has low ion.
wafer ID: 49 has under dose VPI implant.
wafer ID: 49 has low ion.
There were 46 wafer(s) tested; 14 failed.
The following wafers are good wafers with a 0 out of control or out of spec. parameters: 4.
Please pull out the following failed wafer id(s) trom the lot 2, 8, 11, 14, 23, 26, 27, 27, 33, 34, 41, 44, 45, 49.

As a second example, consider the rule in FIG. 5B. Again, the process begins by selecting whether a wafer- or a lot-level diagnosis is to be performed, step 402. Assume the rule is applied at the wafer level to wafer #2, step 404.

First, the pass status of each electrical parameter comprising the rule is checked, step 420. Table 300C, the wafer-level failed parameters summary table, is accessed, step 422. As can be seen in FIG. 5B, the rule tests the following electrical parameters: 50/0.9 VTN, 50/0.9 VTP, and 25/25C VTN. The following logic string is then assembled, step 424: "BB[global ptr1] contains "FAIL" AND BB[global ptr2] contains "FAIL" AND BB[global ptr3] contains "FAIL" ".

There are three logic terms, one for each of the three parameters in the rule shown in FIG. 5B. The string "OK/FAIL" in each logic term is derived from the pass status attribute of each parameter comprising the rule. The array BB[] is filled either with "OK" or "FAIL" by scanning the wafer-level failed parameters summary table 300C. The average value for each parameter is used. If the average value of a given parameter has a failure indication symbol ("#", "*", "?"), then "FAIL" will be placed in the BB[] entry, otherwise "OK" will be placed in the BB[] entry. Note that "OK" will be placed in the BB[] entry if the parameter does not appear in the failed parameters summary table. Thus with respect to the failed parameters summary table for wafer #2, it can be seen that parameters 50/0.9 VTN, 50/0.9 VTP, and 25/25C VTN each has an asterisk (*) next to its corresponding average value, and so BB[ptr1], BB[ptr2], and BB[ptr3] each will be made to contain "FAIL".

For this step, the three logic terms are always connected by an AND operator, meaning that the pass status of each parameter comprising the rule must be in accordance with the pass status attribute corresponding to the parameter.

Finally, in step 426, the assembled logic string is passed on to an evaluati on utility provided by the RPL programming language. An example of the function call is:

call exec (ptr$_{13}$ logic_string, true, successful);
where ptr_logic_string is a pointer to the string: " BB[global ptr1] contains "FAIL" AND BB[global ptr2] contains "FAIL" AND BB[global ptr3] contains "FAIL" ". In this case the string will evaluate to TRUE.

Continuing with FIGS. 4 and 5B, the off target limit attributes are evaluated to determine if any of the electrical parameters comprising the rule exceeds an engineer-determined limit, step 440. For each electrical parameter comprising the rule, the percent off target value in the failed parameters summary table 300C for wafer #2 is obtained, step 442. However, Thus with respect to the example rule in FIG. 5B, the electrical parameters that will be checked are 50/0.9 VTN, 50/0.9 VTP, and 25/25C VTN. Since columns 2 and 3 of the fuzzy logic row are not empty, the formulas contained therein (Eqns. 1 and 2) are used to compute the off target limits, namely 50/0.9 VTN=6.8715% and 50/0.9 VTP= 3.785%.

Next, the off target limit attribute is extracted (parsed) from the rule shown in FIG. 5B, step 444. In this case the attributes are "<15", "<15", and ">50" respectively for parameters 50/0.9 VTN, 50/0.9 VTP, and 25/25c VTN. The measurements and the off target limits are then combined to produce a logic string, step 446. This involves first forming the comparison terms, namely "((6.8715)<15)" for the 50/0.9 VTN parameter, "((3.785)<15)" for the 50/0.9 VTP parameter, and "((100)>50)" for the 25/25C VTN parameter.

Next, the comparison terms are combined to form a boolean logic string. The logic connectors are obtained from the boolean attributes in the rule table, FIG. 5B. Each parameter has an associated logic connector. Thus, parameter 50/0.9 VTN has an OR connector, and so the substring ""((6.875)<15) OR " is produced. The next parameter, 50/0.9 VTP also has an OR connector, and so the substring "((3.785)<15) OR " is concatenated with the first substring to produce "((6.875)<15) OR ((3.785)<15) OR ". The last comparison term is then concatenated to form the final boolean logic string, namely "((6.875)<15) OR ((3.785)<15) OR ((100)>50)".

Finally, the logic string is then evaluated to produce a boolean result, step 448. The evaluation is done as described above, by making a "call exec()" function call and passing to the function a pointer to the above string. In this case the string evaluates to TRUE.

In constructing the comparison strings, the absolute value attribute can be used to modify the resulting string. In the example rule of FIG. 5B, the absolute attributes are FALSE, and so no modification occurs.

Continuing with flow chart 400, after the off target check is made the valid flag attributes are processed, step 460. If any parameter for a given rule is deemed invalid, the failure mode associated with the rule will not be reported for the wafer. This screens out false positive determinations of a failed wafer, when in fact the out of spec. parameters were the result of a failure in the test system or due to some other non-process error.

For each parameter in the rule, its valid flag is checked, step 462. For each valid flag that is TRUE, the percent invalid value for the corresponding parameter in the wafer-level failed parameters summary table is checked, step 464. If the percent invalid value is less than 100%, then at least one of the measurements for that parameter was valid and the parameter is deemed to be valid.

The following sequence occurs to build the boolean logic string, step 466. First, a default logic value of FALSE is provided resulting in the boolean string: "FALSE". Next, the first parameter 50/0.9 VTN has a valid attribute of TRUE, meaning that the validity of this parameter must be checked. Consulting the wafer-level failed parameters summary table 300C for wafer #2, it can be seen that this parameter has 0% invalid data. Thus, " OR FALSE" is concatenated to the boolean string, resulting in: "FALSE OR FALSE". The next parameter 50/0.9 VTP is then checked in the same manner. As can be seen from summary table 300C, the 50/0.9 VTP parameter also has zero invalid data, and so another " OR FALSE" is concatenated to the boolean string, resulting in: "FALSE OR FALSE OR FALSE". Finally, the 25/25c VTN parameter is checked. Here, it can be seen in table 300C that this parameter is invalid since all five of the measurements for the parameter were out of spec. However, looking at the parameter in rule in FIG. 5B, it can be seen that its valid flag is FALSE, and so there is no need to check the validity of this parameter. The final boolean string to be evaluated, therefore, is: "FALSE OR FALSE OR FALSE".

The logic string is then evaluated to produce a boolean result, step 468. The evaluation is done as described above, by making a "call exec()" function call and passing to the function a pointer to the above string. In this case the string evaluates to FALSE. Recall that the initial default value of "FALSE" is needed in case it is determined that validation was not required for any of the parameters. In such a case, the boolean string would consist only of the one term and would evaluate to FALSE, meaning that there was no invalid data.

Next in flow chart 400 is fuzzy logic processing. However, for a missed VTI implant symptom, fuzzy logic is not used and so processing of the rule is complete.

Finally, a pass/fail determination is made, step 490. This is done by combining the boolean results from steps 426, 448 and 464. If the pass status and off target analyses evaluate to TRUE and the invalid check evaluates to FALSE, then a report will issue indicating that the wafer exhibits the failure mode defined by the rule and that those parameters comprising the rule whose validity is significant tested out to be valid.

What is claimed is:

1. In a semiconductor wafer manufacturing system, an automated method of determining defects in wafers by analyzing their electrical parameters, comprising the steps of:

making a plurality of measurements on each of a plurality of wafers;

producing computed measurements based on said plurality of measurements;

recording said plurality of measurements and said computed measurements as stored metrics;

for each wafer, selecting a rule defining a wafer failure mode, said rule including (i) a first electrical parameter and a first off-target limit, (ii) a second electrical parameter and a second off-target limit, and (iii) a boolean logic connector;

making a wafer pass/fail determination of said each wafer based on a selected rule, including:
    (i) constructing a first text string comprising said first off-target limit and a stored metric corresponding to said first parameter;
    (ii) constructing a second text string comprising said second off-target limit and a stored metric corresponding to said second parameter;
    (iii) constructing a third text string comprising said first text string followed by said boolean logic connector followed by said second text string; and
    (iv) interpreting said third text string to obtain a wafer off-target determination, said pass/fail determination being based on said wafer off-target determination; and reporting said wafer failure mode for said each wafer resulting in a positive determination of a wafer failure.

2. The method of claim 1 wherein said first and second off-target limits each as an associated comparison operator.

3. The method of claim 2 wherein said substeps of constructing first and second text strings includes: parsing said selected rule to extract said first and second parameters; obtaining the corresponding stored metric; and inserting the corresponding stored metric into said text strings.

4. The method of claim 1 wherein each of said parameters has associated upper and lower specification limits; wherein said rule further includes a pass status flag; and wherein said step of making a pass/fail determination further includes testing whether a stored metric corresponding to a parameter falls within its associated upper and lower specification limits if said pass status flag is set.

5. The method of claim 1 further including detecting for a false positive determination.

6. The method of claim 5 wherein said step of detecting a false positive includes providing in said rule a validity-check flag for each parameter and if said validity-check flag is set then testing whether the corresponding stored metric falls within a valid data range, whereby a false positive exists if the corresponding stored metric falls outside of said valid data range.

7. The method of claim 1 wherein said step of reporting includes sending an email message identifying failed wafers.

8. A method for automated acceptance testing of a plurality of semiconductor wafers, said method comprising the steps of:

specifying and storing in a data table a plurality of rules, each rule identifying a wafer failure mode with each rule including a plurality of electrical parameters;

for each of said rules, storing a plurality of criteria which define said wafer failure mode, including storing either an upper or a lower off-target limit for each of said parameters, storing a pass-status indicator for each of said parameters indicating whether to test if said parameters fall within a first range of values, and storing boolean operators defining boolean relationships among said criteria;

selecting from among said plurality of rules a rule for a first semiconductor wafer;

parsing a selected rule to extract the corresponding criteria;

creating one or more boolean expressions comprising extracted criteria and said boolean operators associated with said selected rule;

executing said boolean expressions to generate boolean results; and making a pass/fail determination for said first semiconductor wafer based on said boolean results.

9. The method of claim 8 further including mathematically combining some of said electrical parameters to produce a fuzzy logic value, comparing said fuzzy logic value with a plurality of fuzzy logic ranges, each fuzzy logic range having a corresponding message, wherein said pass/fail determination includes the message corresponding to the range which includes said fuzzy logic value.

10. The method of claim 8 further including reporting the occurrence of failed wafers.

11. The method of claim 8 further including providing an indication of whether each of said electrical parameters is valid by determining whether said each electrical parameter falls within a second range of values.

12. The method of claim 8 further including:

storing in a summary table electrical measurements made for each tested semiconductor wafer;

computing statistics of said electrical measurements;

storing in said summary table upper and lower test specification limits for each electrical measurement; and storing in said summary table upper and lower valid-measurement limits for each electrical measurement;

said step of creating one or more boolean expression text strings including extracting information from said summary table.

13. The method of claim 12 further including providing an indication of whether each of said electrical measurements is valid by determining whether said each electrical measurement falls within said upper and lower valid-measurement limits.

14. A semiconductor wafer inspection system comprising:

a wafer testing device for making electrical measurements of a wafer;

a data store for storing metrics coupled to said wafer testing device to receive said electrical measurements, said metrics including said electrical measurements and computed values from said electrical measurements;

a rules data store, each rule having a plurality of parameters, each parameter having a plurality of attributes including a comparison value, a boolean connector, a measurement pass-fail indicator, and a valid measurement indicator; and a computing unit coupled to said data store and to said rules data store;

said computing unit having first computer program instructions to create logic statements from said attributes of said parameters of a selected rule;

said computing unit further having second computer program instructions to interpret said logic statements to produce logic results;

said computing unit further having third computer program instructions to make a pass/fail determination based on said logic results.

15. The semiconductor wafer inspection system of claim 14 further including a user interface to access said rules data store to create and modify said rules.

16. The semiconductor wafer inspection system of claim 14 wherein said first computer program instructions include program instructions to extract said metrics from said data store; whereby some of said logic statements include said metrics from said data store.

17. The semiconductor wafer inspection system of claim 14 wherein said third computer program instructions include program instructions which determine whether a metric is valid before making a pass/fail determination.

18. The semiconductor wafer inspection system of claim 14 wherein said computing unit further includes fourth computer program instructions to combine some of said metrics to produce fuzzy logic values and to compare said fuzzy logic values against a plurality of fuzzy logic ranges.

19. The semiconductor wafer inspection system of claim 14 wherein said computed values include statistical computations of said electrical measurements including average values and standard deviation values.

20. The semiconductor wafer inspection system of claim 19 wherein said computed values include a percentage of spread computation.

21. The semiconductor wafer inspection system of claim 20 wherein said computed values include a percentage of invalid computation.

22. The semiconductor wafer inspection system of claim 21 wherein said computed values include a percentage of off-target computation.

\* \* \* \* \*